(12) United States Patent
Hedler et al.

(10) Patent No.: US 7,074,649 B2
(45) Date of Patent: Jul. 11, 2006

(54) METHOD FOR PRODUCING AN INTEGRATED CIRCUIT WITH A REWIRING DEVICE AND CORRESPONDING INTEGRATED CIRCUIT

(75) Inventors: Harry Hedler, Germering (DE); Roland Irsigler, München (DE); Thorsten Meyer, Dresden (DE)

(73) Assignee: Infineon Technologies AG, Munich (DE)

( * ) Notice: Subject to any disclaimer, the term of this patent is extended or adjusted under 35 U.S.C. 154(b) by 79 days.

(21) Appl. No.: 10/721,745

(22) Filed: Nov. 26, 2003

(65) Prior Publication Data

US 2005/0014309 A1    Jan. 20, 2005

(30) Foreign Application Priority Data

Nov. 29, 2002   (DE) ................................ 102 55 844

(51) Int. Cl.
*H01L 21/60* (2006.01)
*H01L 23/12* (2006.01)

(52) U.S. Cl. ...................... 438/108; 438/125; 257/701

(58) Field of Classification Search ................ 438/106, 438/108, 612–614, 123, 116, 124–127; 257/778, 257/738, 781, 668–680, 747, 737, 795
See application file for complete search history.

(56) References Cited

U.S. PATENT DOCUMENTS 6,140,707 A * 10/2000 Plepys et al. ................ 257/778
6,573,598 B1 * 6/2003 Ohuchi et al. .............. 257/734

FOREIGN PATENT DOCUMENTS

| DE | 197 02 014 | 4/1998 |
|----|------------|--------|
| DE | 199 60 249 | 7/2001 |
| DE | 101 38 042 | 11/2002 |
| JP | 2001332653 A | 11/2001 |

* cited by examiner

*Primary Examiner*—Stephen W. Smoot
(74) *Attorney, Agent, or Firm*—Morrison & Foerster LLP

(57) ABSTRACT

The present invention provides a method for producing an integrated circuit with a rewiring device. In the method, there is provision of a carrier device with defined cutouts, application of at least one integrated circuit upside down to the carrier device such that the defined cutouts of the carrier device are located above at least one connection device of the integrated circuit application of an insulation device to that side of the carrier device which is not covered by the integrated circuit, omitting the at least one connection device in the cutout); application of the patterned rewiring device to the insulation device; application of a patterned solder resist device to the patterned rewiring device; and patterned application of solder balls on sections of the rewiring device which are not covered by the patterned solder resist device. The present invention likewise provides such an apparatus.

19 Claims, 3 Drawing Sheets

METHOD FOR PRODUCING AN INTEGRATED CIRCUIT WITH A REWIRING DEVICE AND CORRESPONDING INTEGRATED CIRCUIT

CLAIM FOR PRIORITY

This application claims priority to German Application No. 10255844.2 filed Nov. 29, 2002, which is incorporated herein, in its entirety, by reference.

TECHNICAL FIELD OF THE INVENTION

The present invention relates to a method for producing an integrated circuit with a rewiring device, and a corresponding integrated circuit.

BACKGROUND OF THE INVENTION

CSPs (chip scale packages) have to date predominantly been constructed on prefabricated substrate strips. In accordance with known CSP technologies based on a substrate, such as Tessera μBGA (micro ball grid array), for example, the rewiring (redistribution lines) or at least parts thereof are already integrated into the prefabricated substrate. Such a rewiring present on the substrate is then contact-connected by means of bonding wires or TAB bonding to an integrated circuit or a chip. The production of the substrate requires complicated and expensive process steps which increase the costs for the substrate. Furthermore, the production and the subsequent process steps are effected with a low degree of parallelism, e.g. in panels or strips with fewer than 150 chips. Both causes have hitherto prevented a further lowering of the production costs of CSPs. Fan-out rewirings can also be generated by means of CSP technologies based on a substrate, for example by means of the BGA technology.

Wafer level package technologies (WLP) likewise provide a cost-effective technology for producing chip scale packages (CSPs), but without being able to provide fan-out rewirings. The wafer level package technologies utilize as a basis the front end wafer, on which the thin-film technique is used in order to produce the fan-in rewiring, the insulation layers, such as e.g. a solder resist layer, and the solder balls. Although the technology steps used in this case for metallization, i.e. sputtering and electrodeposition, for structure production, i.e. photolithography, and for producing protection layers, i.e. spin coating, are cost-intensive, the individual costs per chip can be kept low on account of the high degree of parallelism (entire wafer with up to 1000 chips). In addition, in the future more cost-effective printing technologies will increasingly replace the expensive photolithographic process steps. New printing technologies will make it possible to produce a mask technique using the printing method, which can be used for the highly accurate contact connection of contact pads on a wafer, typical contact pad spacings comprising 130 μm, for example, and typical pad openings comprising 60 μm. Printing processes can thus be used for structure production of rewiring devices or insulation wires on a new panel. However, the WLP production cannot be used to produce fan-out rewirings, i.e. rewirings which project beyond the chip edge.

SUMMARY OF THE INVENTION

The present invention provides a method for producing an integrated circuit with a rewiring device and an integrated circuit in a cost-effective manner.

The present invention combines process steps of wafer level package technologies together with substrate-based CSP technologies. Thus, prefabricated substrates with rewiring layers are avoided, rather a rewiring device is only produced during the production process of the chip scale package on a simple, large-area substrate with a high degree of parallelism.

In one embodiment of the present invention, there is a method for producing an integrated circuit with a rewiring device. The method includes, for example, provision of a carrier device with predefined or subsequently patterned cutouts; application of at least one integrated circuit upside down to the carrier device such that the defined cutouts of the carrier device are located above at least one connection device of the integrated circuit; application of an insulation device to that side of the carrier device which is not covered by the integrated circuit, omitting the at least one connection device in the cutout; application of the patterned rewiring device to the insulation device; application of a patterned solder resist device to the patterned rewiring device; and patterned application of solder balls on regions which are not covered by the patterned solder resist device.

One advantage is that the rewiring or parts thereof do not already have to be provided on a substrate or a carrier device from the outset. In addition, a fan-out design is possible, i.e. rewirings which project beyond the chip edge. Furthermore, the size of the carrier device may considerably exceed that of conventional substrates, e.g. with integrated rewiring layers. In particular, the size may also exceed the wafer area since panel sizes of 600 mm×400 mm can be realized even without considerable cost expenditure. Additionally, such a carrier device or panel does not have to be round like a wafer, for example, but rather may also be formed in rectangular fashion in a manner adapted to the chip geometry.

In addition to these directly cost-effective advantages, the present invention affords further beneficial advantages in that greater freedom in the choice of materials is available, that production of multichip units, so-called multichip modules, with integrated circuits or chips of different form and size is also made possible since the population of the carrier device is not restricted to uniform chips, and in that there is a possibility for the multi-die test and burn-in after complete processing, similar to the wafer level test (WLT) and wafer level burn-in (WLBI) already known.

In accordance with one preferred embodiment, the carrier device is a film in which the at least one cutout is present, or is subsequently produced, in the form of a stamped-out hole.

In accordance with a further preferred embodiment, before the application of the integrated circuit, an adhesive is applied to the carrier device.

In accordance with a further preferred embodiment, the carrier device is clamped in a clamping-in device such as e.g. a frame.

In accordance with a further preferred embodiment, a multiplicity of integrated circuits are applied to the carrier device by means of a placement device, such as e.g. a pick-and-place tool.

In accordance with a further preferred embodiment, a protection device is applied above the carrier device and the at least one integrated circuit applied.

In accordance with a further preferred embodiment, the protection device is applied in an injection-molding method, in a printing process or a potting process and/or is subsequently cured.

In accordance with a further preferred embodiment, a polymer is applied as the insulation device.

In accordance with a further preferred embodiment, the insulation device is printed on or produced in a photolithographic process.

In accordance with a further preferred embodiment, the patterned rewiring device is applied to the insulation device by means of: application of a carrier metallization to the insulation device; application and patterning of a mask on the carrier metallization; application of a conductor track metallization in regions of the carrier metallization which are not covered by the patterned mask; removal of the mask; and patterning of the carrier metallization in accordance with the conductor track metallization structure.

In accordance with a further preferred embodiment, the carrier metallization is sputtered on and/or the mask is patterned photolithographically and/or the conductor track metallization is electrochemically plated and/or the carrier metallization is patterned in an etching step.

In accordance with a further preferred embodiment, the solder resist device has a polymer.

In accordance with a further preferred embodiment, the solder resist device is printed on.

In accordance with a further preferred embodiment, the solder balls are applied in patterned fashion in a printing process and are subsequently reliquefied, preferably in a furnace, and solder balls are formed.

In accordance with a further preferred embodiment, a multiplicity of integrated circuits on a carrier device, after the application of the solder balls, are separated into individual integrated circuits or groups of integrated circuits.

In accordance with a further preferred embodiment, a multiplicity of integrated circuits with rewiring devices on the carrier device undergo a functional test prior to the separation.

In accordance with a further preferred embodiment, the patterned rewiring device is patterned in such a way that it extends laterally beyond the chip edge.

In accordance with a further preferred embodiment, multichip modules are formed, which preferably have different individual ICs.

BRIEF DESCRIPTION OF THE DRAWINGS

An exemplary embodiment of the invention is illustrated in the drawings and is explained in more detail in the description below.

In the figures.

In the figures, identical reference symbols designate identical or functionally identical constituent parts.

DETAILED DESCRIPTION OF THE INVENTION

Figure 1:
FIGS. 1–10 show a cross-sectional view of individual stages in the production process of an integrated circuit with a rewiring device for elucidating an embodiment of the present invention.

FIG. 1 illustrates a carrier device 10 provided with vertically continuous cutouts 11. The carrier device 10 or the substrate is a film or a flexible substrate, for example, the cutouts 11 being present e.g. in the form of stamped holes.

Figure 2:
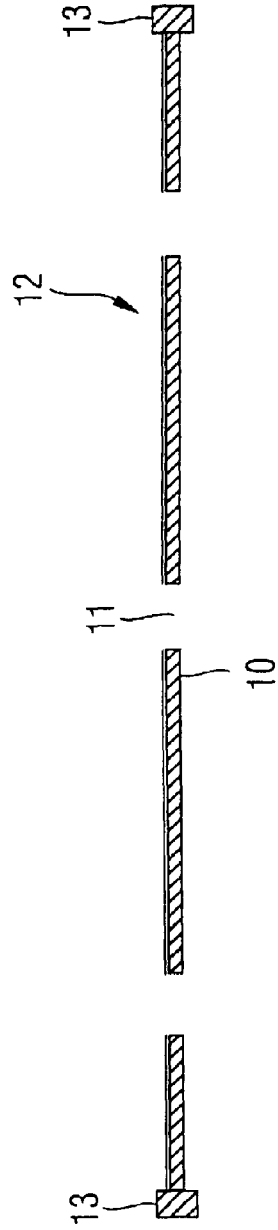

In accordance with FIG. 2, the carrier device 10 with the cutouts 11 provided therein is provided with an adhesive 12 at the top side and clamped into a frame 13. Said frame 13 may have both round and angular forms and its size is limited only by the requirements in the subsequent process steps, for example, printing technique, photolithography. In particular, the size of the carrier device 10 can extend to wafer size (200 mm, 300 mm), but also beyond that.

Figure 3:
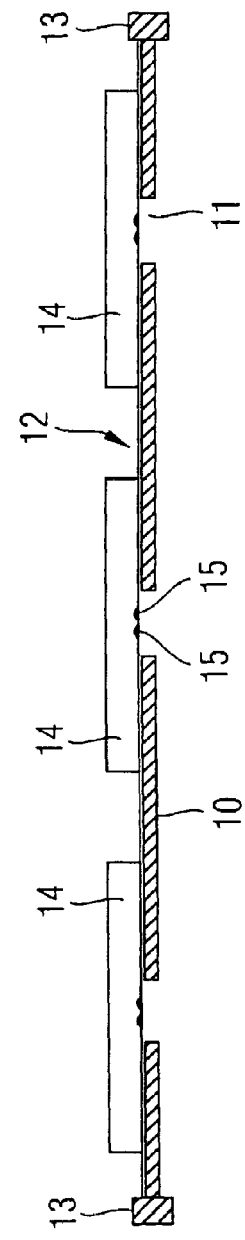

In a subsequent process step, in accordance with FIG. 3, integrated circuits 14 are applied and positioned upside down on the carrier device 10 with adhesive 12 applied thereto such that connection devices 15, such as contact pads, of the integrated circuit 14 are located in the region of the cutouts 11. In this case, the distance between the integrated circuits 14 or the distance between the cutouts 11 is preferably chosen such that a rewiring layer that is subsequently to be created, on that side of the substrate film 10 or carrier device which is not provided with adhesive 12, can be led laterally beyond the chip edge. The integrated circuits 14 can be applied and positioned by means of a placement device, such as a pick-and-place tool, for example.

Figure 4:
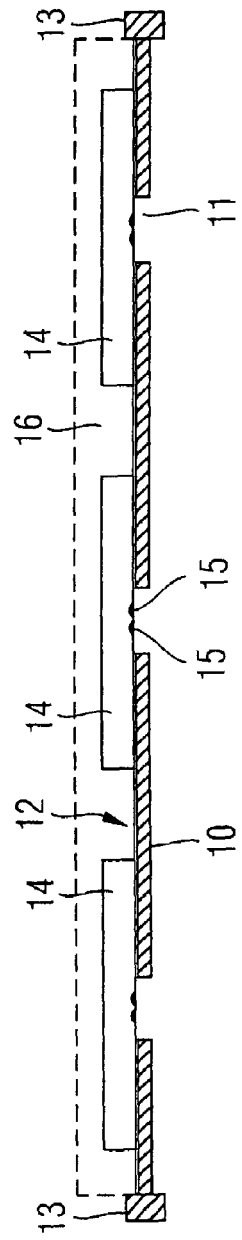

For the protection of the integrated circuits 14, in accordance with FIG. 4, a protection device 16 is preferably provided above the integrated circuits 14 on the side remote from the contact pads 15. Consequently, if appropriate before the production of a rewiring device, the entire chip assembly comprising a multiplicity of integrated circuits 14 on the carrier device 10 is provided with a protection device 16 by means of an injection-molding method or another potting or printing method, which protection device is subsequently cured. A rigid composite, similar to a wafer, can be obtained as a result.

Figure 5:
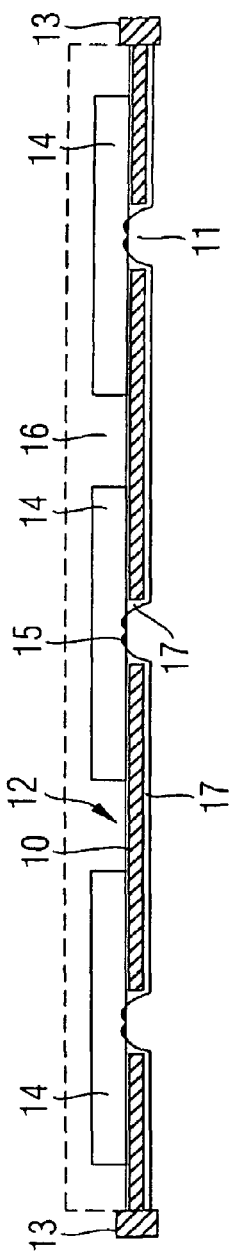

FIG. 5 shows the arrangement in accordance with FIG. 4 after the application of an insulation device 17 on that side of the carrier device 10 which is not provided with integrated circuits 14, no insulation device 17 being applied over the connection devices 15 or contact pads in the cutouts of the carrier device 11. The insulation device 17, preferably a polymer, is applied e.g. photolithographically or in a printing method.

Figure 6:
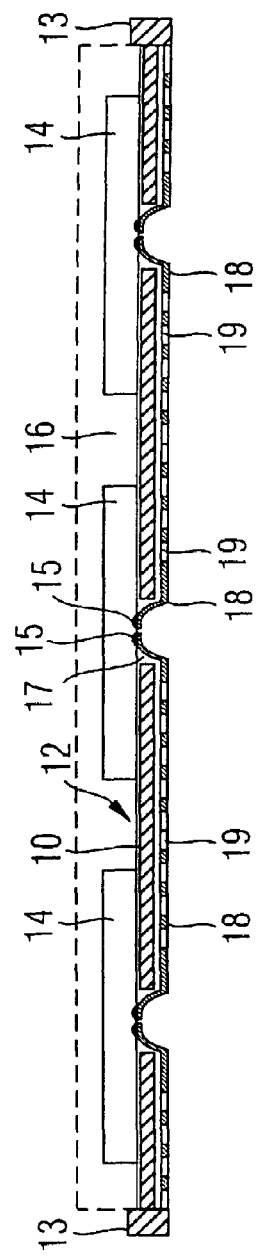

A rewiring device 18, 19 is thereupon applied on the insulation device 17 in accordance with FIG. 6. The rewiring device 18, 19 has electrically conductive sections 18 or conductor track sections and electrically insulating sections 19, the conductor track sections 18 being at least partly contact-connected to the contact pads 15. The rewiring metallization 18 of the rewiring device 18, 19 is preferably formed as follows: sputtering of a carrier metallization onto the insulation device 17; application and photolithographic patterning of a mask (not illustrated); electrochemical deposition of the conductor track metallization 18 on the sputtered-on carrier metallization in sections not covered by the mask; removal of the mask; and etching of the carrier metallization patterned in such a way as the conductor track metallization 18. In addition, an electrically nonconductive material 19 may be provided laterally between the conductor track sections 18. Consequently, the rewiring layer 18, 19 is produced by means of thin-film or printing technology on that side of the carrier device 10 or substrate film which is not provided with the integrated circuits 14.

Figure 7:
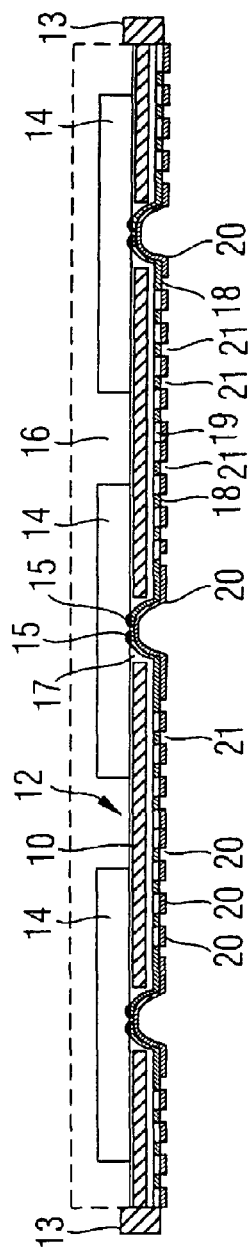

After a further method step, in accordance with FIG. 7, a solder resist device 20 has been applied to the rewiring device 18, 19 in patterned fashion preferably in a printing process. Said solder resist device 20, preferably comprising a polymer, is patterned in such a way that cutouts are provided over predetermined sections 21 of the conductor track metallization 18 of the rewiring device 18, 19.

Figure 8:
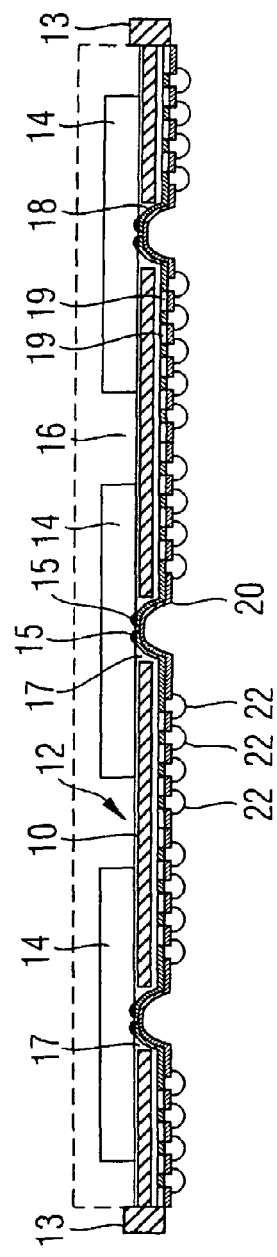

In accordance with FIG. 8, solder 22 is applied in the cutouts 21 in the solder resist device 20 over the predetermined sections 21 of the conductor track metallization 18, preferably in a printing process.

Figure 9:
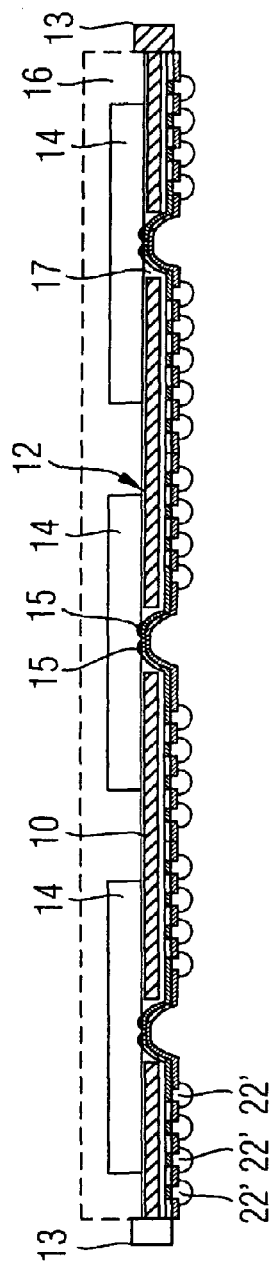

In the arrangement in accordance with FIG. 9, these solder balls 22 have been reliquefied, preferably in a reflow furnace, and subsequently cooled, thereby forming solder balls 22'.

Figure 10:
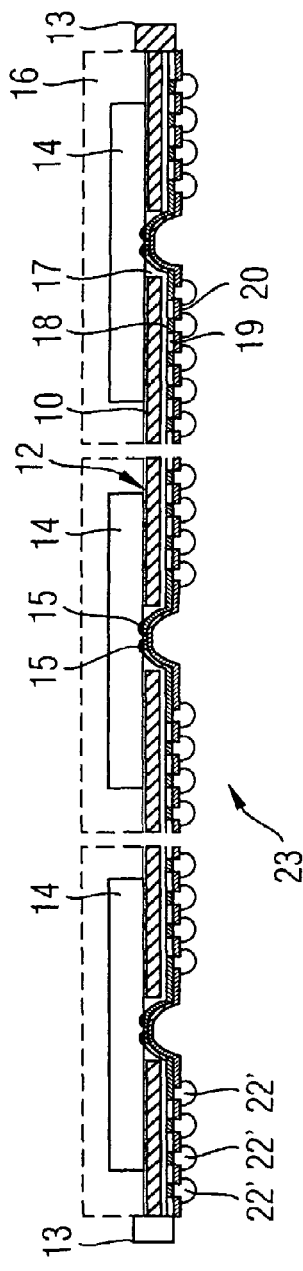

Following FIG. 10, the chip composite comprising a plurality of integrated circuits 14 has been divided into separated integrated circuits 23 with fan-out rewiring device 18, 19, 20.

Figure 11:
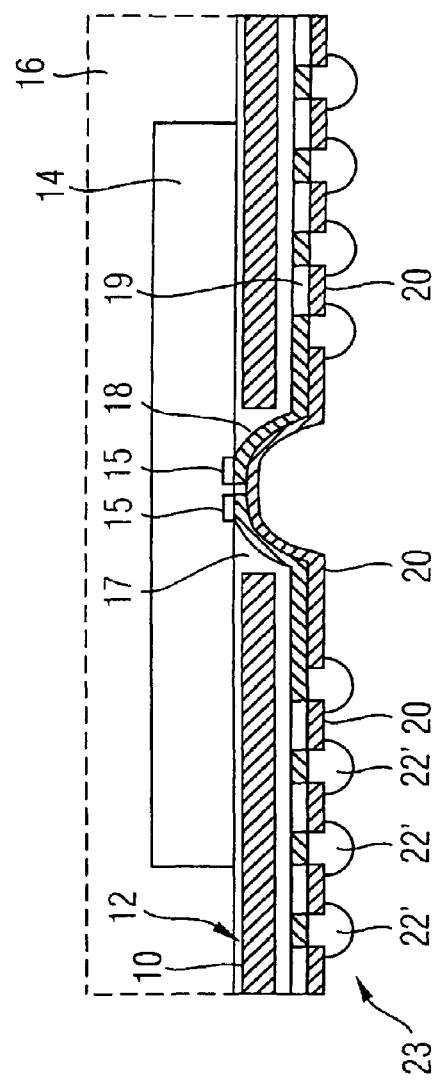
FIG. 11 shows a cross-sectional view of an integrated circuit with a rewiring device for elucidating an embodiment of the present invention in an enlarged illustration.

The arrangement in accordance with FIG. 11 shows in detail such a separated integrated circuit 23 which has been produced in accordance with the method according to the invention. By means of the procedure described, in a manner similar to that in the case of a prefabricated substrate, i.e. with rewiring layers, a rewiring technology is provided which, however, according to the present invention, can be produced with a high degree parallelism and can thus be produced cost-effectively.

This technology according to the invention utilizes WLP processes, fan-out designs now also being possible. The integrated circuits 23 with rewiring device are preferably separated in a dicer.

Although the present invention has been described above on the basis of a preferred exemplary embodiment, it is not restricted thereto, but rather can be modified in diverse ways.

Thus, in particular, the materials explained (polymer, . . . ) are to be regarded as by way of example.

Furthermore, the rewiring device 18, 19, 20, 22 can also be produced in an alternative way.

LIST OF REFERENCE SYMBOLS

10 Carrier device, preferably flexible, e.g. film
11 Cutout in carrier device, e.g. stamped
12 Adhesive
13 Frame
14 Integrated circuit
15 Connection device, e.g. contact pads
16 Protection device
17 Insulation device, preferably a polymer
18 Conductive device, e.g. conductor track metallization
19 Nonconductive device
20 Solder resist device, preferably a polymer
21 Section of the conductor track metallization that is not covered by solder resist device (cutout in polymer)
22 Solder ball
22' Reliquefied solder ball
23 Separated integrated circuit with fan-out rewiring device

What is claimed is:

1. A method for producing an integrated circuit with a rewiring device, comprising:
   providing a carrier device with predefined or subsequently patterned cutouts;
   applying at least one integrated circuit upside down to the carrier device such that the cutouts of the carrier device are located above at least one connection device of the integrated circuit;
   applying an insulation device to a side of the carrier device which is not covered by the integrated circuit, omitting the at least one connection device in the cutout;
   applying the patterned rewiring device to the insulation device;
   applying a patterned solder resist device to the patterned rewiring device; and
   applying, in a patterned manner, solder balls on sections of the rewiring device which are not covered by the patterned solder resist device.

2. The method according to claim 1, wherein the carrier device is a film in which at least one of the cutouts is present in the form of a stamped-out hole.

3. The method according to claim 1, wherein, before application of the integrated circuit, an adhesive is applied to the carrier device.

4. The method according to claim 1, wherein the carrier device is clamped in a clamping-in device.

5. The method according to claim 1, wherein a multiplicity of integrated circuits are applied to the carrier device by a placement device.

6. The method according to claim 1, wherein a protection device is applied above the carrier device and the at least one integrated circuit applied.

7. The method according to claim 6, wherein the protection device is applied in an injection-molding or another potting or printing process and/or is subsequently partly or completely cured.

8. The method according to claim 1, wherein a polymer is applied as the insulation device.

9. The method according to claim 8, wherein the insulation device is printed on or produced in a photolithographic process.

10. The method according to claim 8, wherein the patterned rewiring device is applied to the insulation device by:
    applying a carrier metallization to the insulation device;
    applying and patterning of a mask on the carrier metallization;
    applying a conductor track metallization in regions of the carrier metallization which are not covered by the patterned mask;
    removing the mask; and
    patterning of the carrier metallization in accordance with the conductor track metallization structure.

11. The method according to claim 1, wherein the carrier metallization is sputtered on and/or the mask is patterned photolithographically and/or the conductor track metallization is electrochemically plated and/or the carrier metallization is patterned by etching.

12. The method according to claim 1, wherein the solder resist device has a polymer.

13. The method according to claim 1, wherein the solder resist device is printed on.

14. The method according to claim 1, wherein the solder balls are applied in patterned fashion in a printing process and are subsequently reliquefied, preferably in a reflow furnace.

15. The method according to claim 1, wherein a multiplicity of integrated circuits on a carrier device, after the application of the solder balls, are separated into individual integrated circuits or groups of integrated circuits.

16. The method according to claim 15, wherein a multiplicity of integrated circuits with rewiring devices on the carrier device undergo a functional test prior to the separation.

17. The method according to claim 1, wherein the patterned rewiring device is patterned such that it extends laterally beyond the integrated circuit.

18. The method according to claim 1, wherein multichip modules are formed, which have different individual ICs.

19. An integrated circuit with a rewiring device comprising:
    a carrier device with predefined or subsequently patterned cutouts;

at least one integrated circuit upside down on the carrier device such that the defined cutouts of the carrier device are located above at least one connection device of the integrated circuit;

an insulation device on a side of the carrier device which is not covered by the integrated circuit, omitting the at least one connection device in the cutout;

the patterned rewiring device on the insulation device;

a patterned solder resist device on the patterned rewiring device; and solder balls on sections on the rewiring device which are not covered by the patterned solder resist device.

* * * * *